United States Patent
Anderson et al.

(10) Patent No.: US 12,419,024 B2
(45) Date of Patent: Sep. 16, 2025

(54) HIGH DENSITY STATIC RANDOM-ACCESS MEMORY

(71) Applicant: International Business Machines Corporation, Armonk, NY (US)

(72) Inventors: Brent A. Anderson, Jericho, VT (US); Ruilong Xie, Niskayuna, NY (US); Albert M. Chu, Nashua, NH (US); Carl Radens, LaGrangeville, NY (US)

(73) Assignee: International Business Machines Corporation, Armonk, NY (US)

(*) Notice: Subject to any disclaimer, the term of this patent is extended or adjusted under 35 U.S.C. 154(b) by 434 days.

(21) Appl. No.: 18/053,451

(22) Filed: Nov. 8, 2022

(65) Prior Publication Data

US 2024/0155822 A1    May 9, 2024

(51) Int. Cl.
- *H01L 27/11*    (2006.01)
- *H01L 23/48*    (2006.01)
- *H10B 10/00*    (2023.01)

(52) U.S. Cl.
CPC ........... *H10B 10/12* (2023.02); *H01L 23/481* (2013.01)

(58) Field of Classification Search
CPC ...... G11C 11/412; H10B 10/00; H10B 10/12; H01L 23/481
See application file for complete search history.

(56) References Cited

U.S. PATENT DOCUMENTS

| | | | |
|---|---|---|---|
| 8,503,221 B1 | 8/2013 | Hobson | |
| 8,766,376 B2 | 7/2014 | Yang | |
| 10,840,146 B1 | 11/2020 | Paul et al. | |
| 2001/0053089 A1 | 12/2001 | Noble | |
| 2004/0113207 A1 | 6/2004 | Hsu | |
| 2009/0303776 A1 | 12/2009 | Mair | |
| 2015/0318288 A1* | 11/2015 | Lim | H10D 30/025 257/329 |
| 2019/0279990 A1 | 9/2019 | Paul et al. | |
| 2019/0355730 A1 | 11/2019 | Mann et al. | |
| 2020/0203276 A1 | 6/2020 | Hiblot et al. | |
| 2021/0035986 A1 | 2/2021 | Yu et al. | |
| 2022/0223514 A1 | 7/2022 | Sisodia | |

FOREIGN PATENT DOCUMENTS

| | | |
|---|---|---|
| CN | 112309462 A | 2/2021 |
| CN | 120266590 A | 7/2025 |
| KR | 20180130841 A | 3/2019 |
| TW | 202114158 A | 9/2021 |
| TW | 202420933 A | 5/2024 |
| WO | 2024/099851 A1 | 5/2024 |

OTHER PUBLICATIONS

Balobas et al., "Design and evaluation of 6T SRAM layout designs at modern nanoscale CMOS processes", Conference Paper, May 2015, 5 pages.

(Continued)

*Primary Examiner* — Walter H Swanson
(74) *Attorney, Agent, or Firm* — Aaron N. Pontikos

(57) ABSTRACT

A semiconductor memory cell comprising six vertical-transport field-effect transistors (VTFET) on a wafer. The six VTFET are in a first layer. The six VTFET are in a first row.

17 Claims, 8 Drawing Sheets

(56) References Cited

OTHER PUBLICATIONS

Majumdar et al., "Low Power Single Bitline 6T SRAM Cell With High Read Stability", 2011 International conference on recent trends in information systems, IEEE, 6 pages.
Singh et al., "A single ended 6T SRAM cell design for ultra-low-voltage applications", IEICE Electronics Express, DOI: 10.1587/elex.5.750, Sep. 2008, 7 pages.
International Search Report and Written Opinion, International Application No. PCT/EP2023/080487, International Filing Date Nov. 1, 2023.
Intellectual Property Office, "Office Action," Jul. 11, 2025, 10 Pages, KR Application No. 10-2025-7008580.

* cited by examiner

HIGH DENSITY STATIC RANDOM-ACCESS MEMORY

BACKGROUND OF THE INVENTION

The present invention relates generally to the field of semiconductor device manufacture and more particularly a high density static random-access memory using vertical-transport field-effect transistors (VTFET).

Semiconductor devices are fabricated by sequentially depositing insulating (dielectric) layers, conductive layers, and semiconductor layers of material over a semiconductor substrate, and patterning the various layers using lithography to form circuit components and elements thereon. Generally, these semiconductor devices include a plurality of circuits which form an integrated circuit (IC) fabricated on a semiconductor substrate.

A static random-access memory (SRAM) may be formed as a semiconductor device. An SRAM is a random-access memory that uses latching circuitry (flip-flop) to store each bit. A traditional SRAM is formed from six transistors. Two groups of two of the six transistors form two cross-couple inverters that store the bit in the cell. The storage cell has two stable states which are used to denote "0" or VSS and "1" or VDD. The fifth and sixth transistors are access transistors for reading/writing operations. Alternative SRAM configurations are realized that may use 4, 8, or 10 transistors.

Current SRAM circuitry can take up large amounts of space on an integrated circuit. There is a need for a high density SRAM cell that reduces the size requirements and therefore increase the density of SRAM circuitry on an integrated circuit. VTFET, due to the flow of current vertically, has a smaller width and height compared to traditional planar field-effect transistors.

SUMMARY

In a first embodiment, a semiconductor memory cell comprising six vertical-transport field-effect transistors (VTFET) is on a wafer. In the first embodiment, the six VTFET are in a first layer. In the first embodiment, the six VTFET are in a first row. In the first embodiment, power for two of the VTFET of the six VTFET is connected to a power delivery network on a backside of the wafer. In the first embodiment, ground for two of the VTFET of the six VTFET is connected to a power delivery network on a backside of the wafer. In the first embodiment, a bitline and a bitline bar for two of the VTFET of the six VTFET is connected to a power delivery network on a backside of the wafer and wherein a wordline for two of the VTFET of the six VTFET is connected to a power delivery network on a frontside of the wafer. In the first embodiment, a bitline and a bitline bar for two of the VTFET of the six VTFET is connected to a power delivery network on a frontside of the wafer and wherein a wordline for two of the VTFET of the six VTFET is connected to a power delivery network on a backside of the wafer. In the first embodiment, a first metal wire electrically connects a source/drain region of a first VTFET, a source/drain region of a second VTFET, a source/drain region of a third VTFET, a gate region of a fourth VTFET, and a gate region of a fifth VTFET. In a first embodiment, a second metal wire electrically connects a gate region of the second VTFET, a gate region of the third VTFET, a source/drain region of the fourth VTFET, a source/drain region of the fifth VTFET, and a source/drain region of the sixth VTFET. In the first embodiment, the first metal wire is within the semiconductor memory cell. In the first embodiment, the second metal wire is within the semiconductor memory cell. In the first embodiment, a fin end and a gate end of one or more VTFET of the plurality of VTFET are aligned to an RX edge.

In a second embodiment, a plurality of vertical-transport field-effect transistors (VTFET) on a wafer. In the second embodiment, each VTFET of the plurality of VTFET are in a first layer. In the second embodiment, six VTFET of the plurality of VTFET form the memory cell. In the second embodiment, at least one memory cell is in a row adjacent to at least one other memory cell. In the second embodiment, power for two of the VTFET of the six VTFET is connected to a power delivery network on a backside of the wafer. In the second embodiment, ground for two of the VTFET of the six VTFET is connected to a power delivery network on a backside of the wafer. In the second embodiment, a bitline and a bitline bar for two of the VTFET of the six VTFET is connected to a power delivery network on a backside of the wafer and wherein a wordline for two of the VTFET of the six VTFET is connected to a power delivery network on a frontside of the wafer. In the second embodiment, a bitline and a bitline bar for two of the VTFET of the six VTFET is connected to a power delivery network on a frontside of the wafer and wherein a wordline for two of the VTFET of the six VTFET is connected to a power delivery network on a backside of the wafer. In the second embodiment, a first metal wire electrically connects a source/drain region of a first VTFET, a source/drain region of a second VTFET, a source/drain region of a third VTFET, a gate region of a fourth VTFET, and a gate region of a fifth VTFET. In a second embodiment, a second metal wire electrically connects a gate region of the second VTFET, a gate region of the third VTFET, a source/drain region of the fourth VTFET, a source/drain region of the fifth VTFET, and a source/drain region of the sixth VTFET. In the second embodiment, the first metal wire is within the semiconductor memory cell. In the second embodiment, the second metal wire is within the semiconductor memory cell.

In a third embodiment, a semiconductor SRAM comprises six vertical-transport field-effect transistors (VTFET) on a wafer. In the third embodiment, the six VTFET are in a first layer. In the third embodiment, the six VTFET are in a first row.

In the fourth embodiment, a semiconductor memory array comprises a plurality of vertical-transport field-effect transistors (VTFET) on a wafer. In the fourth embodiment, six VTFET of the plurality of VTFET are arranged a memory cell of one or more memory cells in a first layer on the wafer. In the fourth embodiment, each memory cell of the one or more memory cells are in arranged in a single row. In the fourth embodiment, each memory cell of the one or more memory cells share a first continuous bottom source/drain region for a first VTFET and a second VTFET in each memory cell. In the fourth embodiment, the first continuous bottom source/drain region is connected to a power delivery network on a backside of the wafer. In the fourth embodiment, each memory cell of the one or more memory cells share a second continuous bottom source/drain region for a third VTFET and a fourth VTFET in each memory cell. In the fourth embodiment, the second continuous bottom source/drain region is connected to a power delivery network on a backside of the wafer. In the fourth embodiment, each memory cell of the one or more memory cells share a third continuous bottom source/drain region for a fifth VTFET and a fourth continuous bottom source/drain region for a sixth VTFET in each memory cell. In the fourth embodiment, the third continuous bottom source/drain region is connected to a power delivery network on a backside of the wafer. In the fourth embodiment, the fourth continuous bottom source/drain region is connected to a power delivery network on a backside of the wafer In a fifth embodiment, a semiconductor memory array comprises one or more vertical transistors on a wafer. In the fifth embodiment, the one or more vertical transistors are arranged in one or more memory cells in a first layer. In the fifth embodiment, each memory cell of the one or more memory cells are in a single row.

Embodiments of the present invention provide for high density cell layout of SRAM technologies utilizing VTFET. Embodiments of the present invention provide for an SRAM including six VTFET in a single row. Embodiments of the present invention provide for bitline connections on a first side of the SRAM and wordline connections on a second side of the SRAM. Embodiments of the present invention provide for a single line connecting pull down, pass gate, pull up, and cross couple. Embodiments of the present invention provide for fin end and gate end alignment. Embodiments of the present invention provide for any number of signals (e.g., clock, buss, I/O, power, ground, etc.) to be distributed or delivered to source/drain/gate regions of VTFET through a backside power delivery network.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
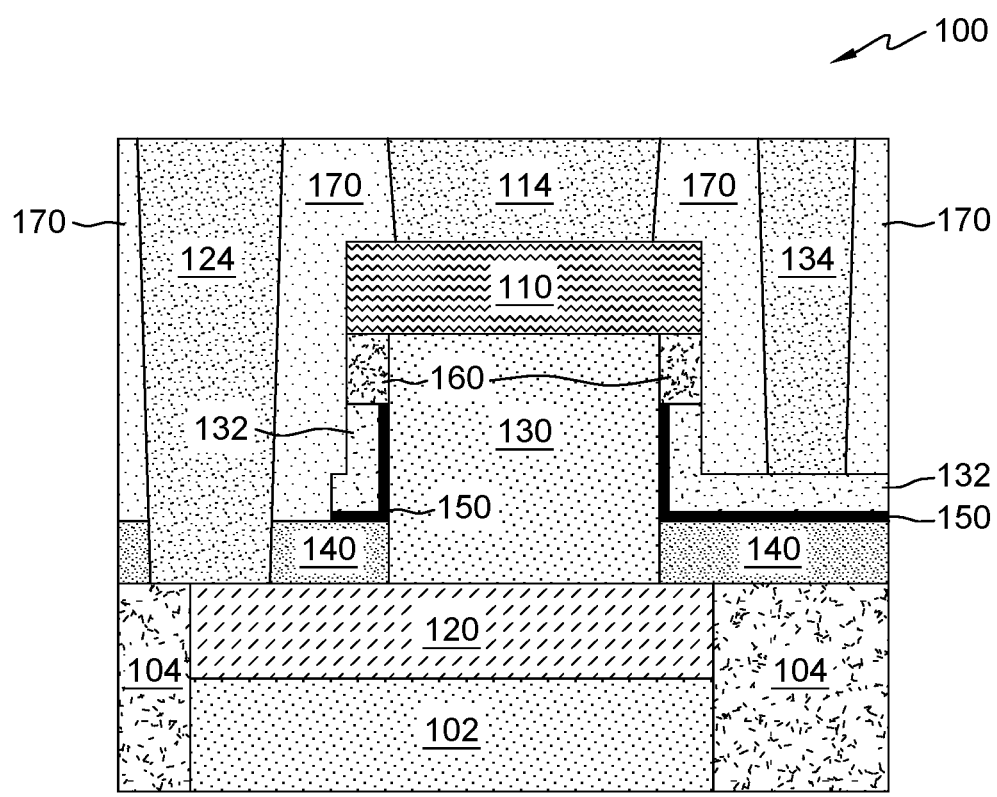
FIG. 1 depicts a cross-section view of a VTFET semiconductor structure with a frontside contact for the top source/drain region, bottom source/drain region, and gate region, in accordance with a first embodiment of the present invention.

Embodiments of the present invention recognize that vertical-transport field-effect transistors (VTFET) have vertical current flow. Embodiments of the present invention recognize that VTFET include a bottom source/drain region and a top source/drain region. Embodiments of the present invention recognize that the bottom source/drain region is closer to the backside of the VTFET (closer to the wafer) and that the top source/drain region is closer to the frontside of the VTFET (closer to the traditional interconnect wiring). Embodiments of the present invention recognize that an input will be to one source/drain region and the output will be to one source/drain region and therefore one of either the input or the output will be on the backside of the device and one of either the input or the output will be on the frontside of the device. Therefore, embodiments of the present invention recognize that VTFET transistors are suitable for use in SRAM technologies.

Embodiments of the present invention provide for high density cell layout of SRAM technologies utilizing VTFET. Embodiments of the present invention provide for an SRAM including six VTFET in a single row. Embodiments of the present invention provide for bitline connections on a first side of the SRAM and wordline connections on a second side of the SRAM. Embodiments of the present invention provide for a single line connecting pull down, pass gate, pull up, and cross couple. Embodiments of the present invention provide for fin end and gate end alignment. Embodiments of the present invention provide for any number of signals (e.g., clock, buss, I/O, power, ground, etc.) to be distributed or delivered to source/drain/gate regions of VTFET through a backside power delivery network.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein. Reference will now be made in detail to the embodiments of the present invention, examples of which are illustrated in the accompanying drawings, wherein like reference numerals refer to like elements throughout.

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later. It is to be understood that aspects of the present invention will be described in terms of a given illustrative architecture; however, other architectures, structures, substrate materials, process features and steps can be varied within the scope of aspects of the present invention.

Detailed embodiments of the claimed structures and methods are disclosed herein. The method steps described below do not form a complete process flow for manufacturing integrated circuits, such as semiconductor devices. The present embodiments can be practiced in conjunction with the integrated circuit fabrication techniques currently used in the art, for advanced semiconductor devices, and only so much of the commonly practiced process steps are included as are necessary for an understanding of the described embodiments. The figures represent cross-section portions of a portion of an advanced semiconductor device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

For purposes of the description hereinafter, the terms "upper," "lower," "right," "left," "vertical," "horizontal," "top", "bottom," and derivatives thereof shall relate to the disclosed structures and methods, as oriented in the drawing figures. The terms "overlying," "atop," "over," "on "positioned on," or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

References in the specification to "one embodiment", "other embodiment", "another embodiment," "an embodiment," etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

Deposition processes for the metal liners and sacrificial materials include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Vertical transport field-effect transistors (VTFETs) have become viable device options for scaling semiconductor devices (e.g., complementary metal oxide semiconductor (CMOS) devices) to 5 nanometer (nm) node and beyond. VTFET devices include one or more fin channels with source/drain regions at ends of the fin channels on the top and bottom sides of the fins. Current flows through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FiN-FET-equivalent density at a larger contacted poly pitch (CPP), and providing lower middle-of-line (MOL) resistance.

Figure 2:
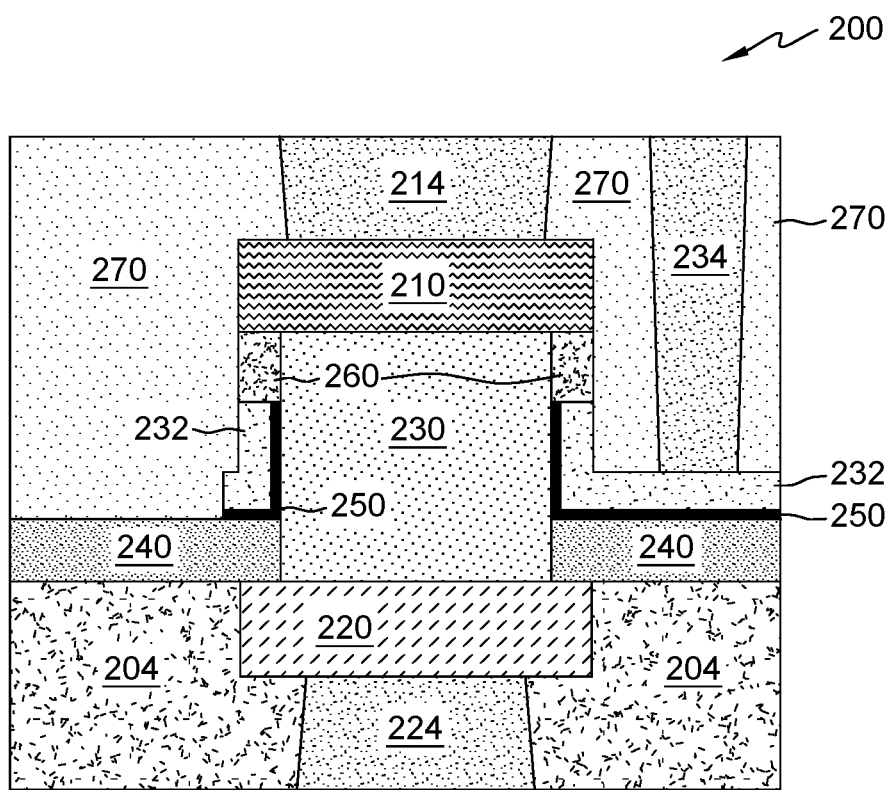
FIG. 2 depicts a cross-section view of a VTFET semiconductor structure with a frontside contact for the top source/drain region and gate region and a backside contact for the bottom source/drain region, in accordance with a first embodiment of the present invention.
Figure 3:
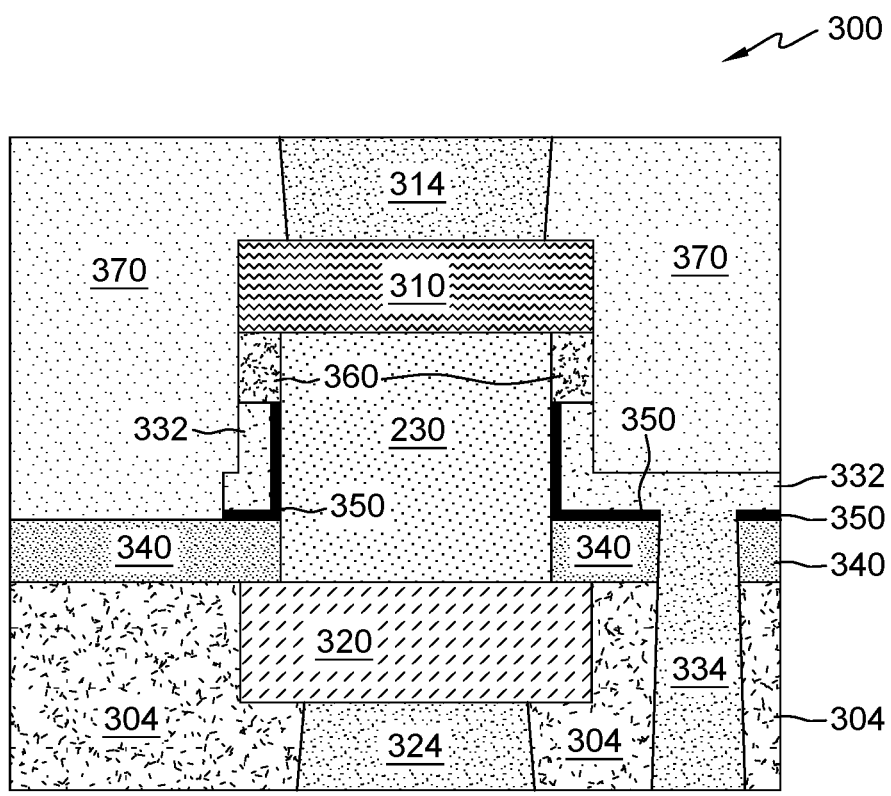
FIG. 3 depicts a cross-section view of a VTFET semiconductor structure with a frontside contact for the top source/drain and a backside contact for the bottom source/drain region and gate region, in accordance with a first embodiment of the present invention.

In a first embodiment, FIG. 1 shows a VTFET 100 with contact 114, contact 124, and contact 134 connected directly to interconnect wiring and/or a power delivery network (not shown) on the frontside of VTFET 100. In a second embodiment, FIG. 2 shows a VTFET 200 with contact 214 and contact 234 connected directly to interconnect wiring and/or a power delivery network (not shown) on the frontside of VTFET 200 and a contact 224 connected directly to interconnect wiring and/or a power delivery network (not shown) on the backside of VTFET 200. In a third embodiment, FIG. 3 shows a VTFET 300 with contact 314 connected directly to interconnect wiring and/or a power delivery network (not shown) on the frontside of VTFET 300 and contact 324 and contact 334 connected directly to interconnect wiring and/or a power delivery network (not shown) on the backside of VTFET 300.

FIG. 1 is a cross-sectional view of a VTFET 100 formed on a bulk substrate 102. The substrate 102 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon.

VTFET 100 includes STI region 104 comprised of a dielectric material such as silicon oxide or silicon oxynitride, and is formed by methods known in the art. For example, in one illustrative embodiment, STI region 104 is a shallow trench isolation oxide layer.

VTFET 100 includes top source/drain region 110 and bottom source/drain region 120 on either end of fin 130. In an embodiment, top source/drain region 110 is formed between dielectric layer 170. In an embodiment, bottom source/drain region 120 is formed in substrate 102 between shallow trench isolation region 104. Top source/drain region 110 and bottom source/drain region 120 are formed by, for example, epitaxial growth processes. The epitaxially grown top source/drain region 110 and bottom source/drain region 120 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1 \times 10^{18}/cm^3$ to $1 \times 10^{21}/cm^3$. According to an embodiment, the bottom source/drain region 120 can be boron doped SiGe for a p-type field-effect transistor (P-FET) or phosphorous doped silicon for an n-type field-effect transistor (N-FET). It is to be understood that the term "source/drain region" as used herein means that a given source/drain region can be either a source region or a drain region, depending on the application.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a 11001 crystal surface will take on a 11001 orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used. After epi formation, drive-in anneals can be applied to move the dopants closer to the bottom of the fin channels.

In an embodiment, as used herein, a "semiconductor fin" or fin 130 refers to a semiconductor material that includes a pair of vertical sidewalls that are parallel to each other. As used herein, a surface is "vertical" if there exists a vertical plane from which the surface does not deviate by more than three times the root mean square roughness of the surface. In an embodiment, each fin 130 has a height ranging from approximately 20 nm to approximately 200 nm, and a width ranging from approximately 5 nm to approximately 30 nm. Other heights and/or widths that are lesser than, or greater than, the ranges mentioned herein can also be used in the present application. Each fin 130 is spaced apart from its nearest neighboring fin 130 by a pitch ranging from approximately 20 nm to approximately 100 nm; the pitch is measured from one point, or reference surface, of one semiconductor fin to the exact same point, or reference surface, on a neighboring semiconductor fin. Also, the fins 130 are generally oriented parallel to each other. Although the present application describes and illustrates a single fin 108, any number of fins with gate region surrounding them may be used and the fins may be any shape.

The fin 130 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, fin 130 is silicon.

In an embodiment, bottom spacer layer 140 is formed on the STI region 104 and bottom source/drain region 120. In an embodiment, bottom spacer layer 140 is formed around fin 130. Suitable material for bottom spacer layer 140 includes, for example, silicon boron nitride (SiBN), silicon-borocarbonitride (SiBCN), silicon oxycarbonitride (SiOCN), SiN and $SiO_x$. Bottom spacer layer 140 can be deposited using, for example, directional deposition techniques, such as a high-density plasma (HDP) deposition and gas cluster ion beam (GCIB) deposition. The directional deposition deposits the spacer material preferably on the exposed horizontal surfaces, but not on the lateral sidewalls. Alternatively, the bottom spacer layer 140 can be formed by overfilling the space with dielectric materials, followed by chemical mechanical planarization (CMP) and dielectric recess.

In an embodiment, top spacer layer 160 is formed on the gate region between fin 130 and dielectric layer 170. In an embodiment, top spacer layer 160 is formed around fin 130. Suitable material for top spacer layer 160 includes, for example, silicon boron nitride (SiBN), siliconborocarbonitride (SiBCN), silicon oxycarbonitride (SiOCN), SiN and $SiO_x$. Bottom spacer layer 140 can be deposited using, for example, directional deposition techniques, such as a high-density plasma (HDP) deposition and gas cluster ion beam (GCIB) deposition. The directional deposition deposits the spacer material preferably on the exposed horizontal surfaces, but not on the lateral sidewalls. Alternatively, the top spacer layer 160 can be formed by overfilling the space with dielectric materials, followed by chemical mechanical planarization (CMP) and dielectric recess.

A gate region is formed on bottom spacer layer 140 and around fin 130. In illustrative embodiments, gate region is deposited on bottom spacer layer 140 and around fin 130 employing, for example, ALD, CVD, RFCVD, plasma enhanced CVD (PECVD), physical vapor deposition (PVD), or molecular layer deposition (MLD). The gate region may include a gate dielectric layer 150 and a gate conductor layer 132. The gate dielectric layer 150 may be formed of a high-k dielectric material. Examples of high-k materials include but are not limited to metal oxides such as $HfO_2$, hafnium silicon oxide (Hf—Si—O), hafnium silicon oxynitride (Hf-SiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate conductor layer 132 may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer 132 as desired.

In an embodiment, dielectric layer 170 may be composed of, for example, silicon oxide ($SiO_x$), undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. As indicated above, the term "low-κ" as used herein refers to a material having a relative dielectric constant κ which is lower than that of silicon dioxide. In an embodiment, the dielectric layer 170 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering.

In an embodiment, top source/drain region 110, bottom source drain region 120 and gate region are connected to interconnect wiring and/or a power delivery network (not shown) through contact 114, contact 124, and contact 134, respectively. In an embodiment, as shown in FIG. 1, contact 114, contact 124, and contact 134 to are formed to directly connect to interconnect wiring and/or a power delivery network (not shown) on the frontside of the VTFET 100. In an embodiment, contact 114, contact 124, and contact 134 may include any suitable conductive material, such as, for example, copper, aluminum, tungsten, cobalt, or alloys thereof. Examples of deposition techniques that can be used include, for example, chemical vapor deposition (CVD), plasma enhanced chemical vapor deposition (PECVD), or atomic layer deposition (ALD). In some cases, an electroplating technique can be used to form contact 114, contact 124, and contact 134.

In a second embodiment, FIG. 2 shows a VTFET 200 with contact 214 and contact 234 connected directly to interconnect wiring and/or a power delivery network (not shown) on the frontside of VTFET 200 and a contact 224 connected directly to interconnect wiring and/or a power delivery network (not shown) on the backside of VTFET 200. In the second embodiment, VTFET 200 shares substantially similar features to the features described above in reference to VTFET 100. For example, top source/drain region 210 is substantially similar to top source/drain region 110. It should be noted, while a substrate, similar to substrate 102 shown in FIG. 1, is not shown in FIG. 2, it would be known to one skilled in the art that VTFET 200 would be formed on a substrate similar to substrate 102 shown in FIG. 1.

In the second embodiment, the orientation of contacts in VTFET 200 are the primary differences as compared to VTFET 100. In the second embodiment, contact 214 and contact 234 are connected directly to interconnect wiring and/or a power delivery network (not shown) on the frontside of VTFET 200 and a contact 224 connected directly to interconnect wiring and/or a power delivery network (not shown) on the backside of VTFET 200.

In a third embodiment, FIG. 3 shows a VTFET 300 with contact 314 connected directly to interconnect wiring and/or a power delivery network (not shown) on the frontside of VTFET 300 and contact 324 and contact 334 connected directly to interconnect wiring and/or a power delivery network (not shown) on the backside of VTFET 300. In the third embodiment, VTFET 300 shares substantially similar features to the features described above in reference to VTFET 100 and VTFET 200. For example, top source/drain region 310 is substantially similar to top source/drain region 110 and top source/drain region 210. It should be noted, while a substrate, similar to substrate 102 shown in FIG. 1, is not shown in FIG. 3, it would be known to one skilled in the art that VTFET 300 would be formed on a substrate similar to substrate 102 shown in FIG. 1.

In the third embodiment, the orientation of contacts in VTFET 300 are the are the primary differences as compared to VTFET 100 and VTFET 200. In the third embodiment, contact 314 is connected directly to interconnect wiring and/or a power delivery network (not shown) on the frontside of VTFET 300 and contact 324 and contact 334 are connected directly to interconnect wiring and/or a power delivery network (not shown) on the backside of VTFET 300.

Figure 4:
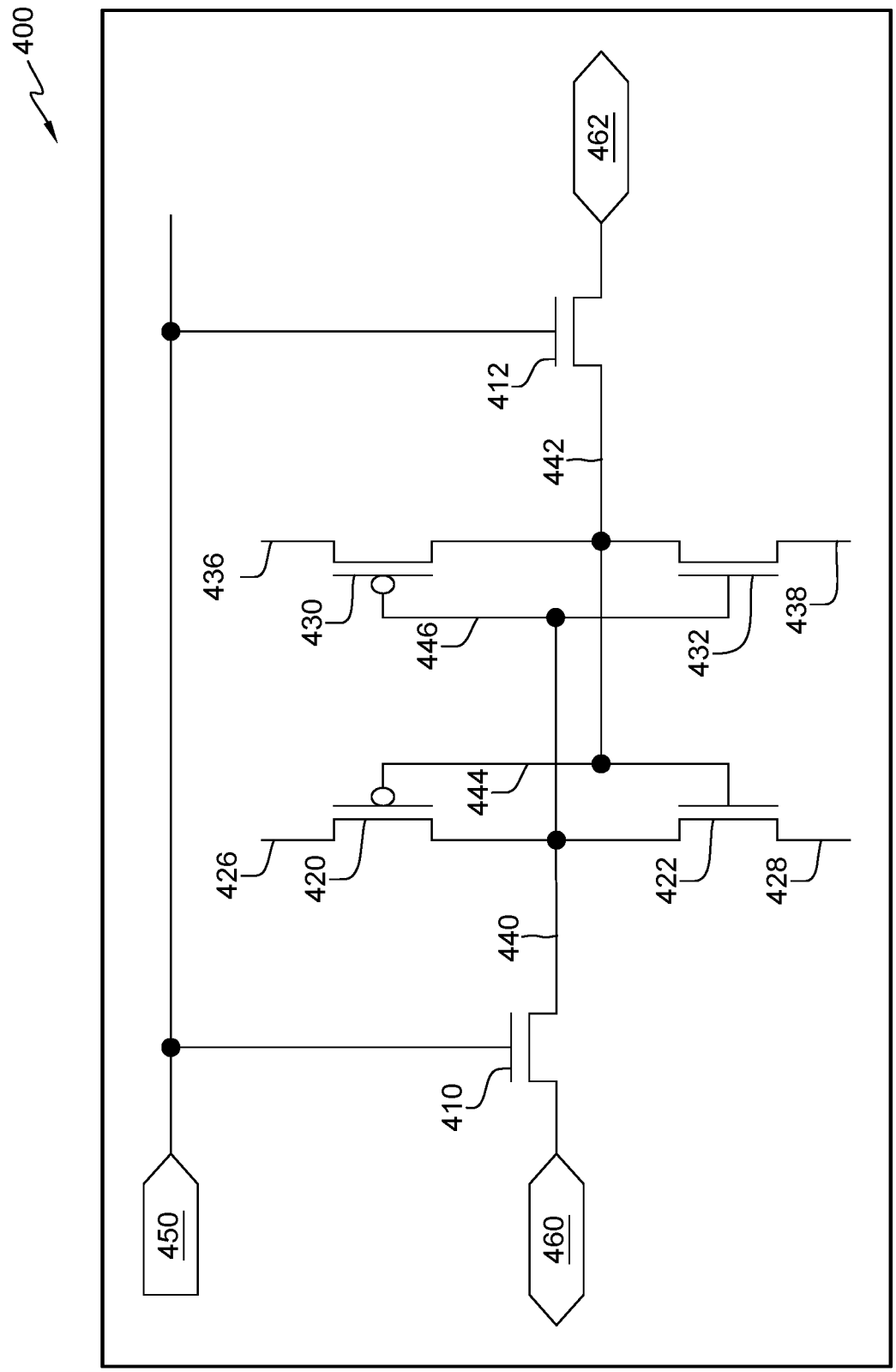
FIG. 4 depicts a circuit schematic of an SRAM in accordance with an embodiment of the present invention.

FIG. 4 depicts a circuit schematic of an SRAM 400 in accordance with an embodiment of the present invention. In an embodiment, SRAM 400 consists of six transistors, first transistor 410, second transistor 412, third transistor 420, fourth transistor 422, fifth transistor 430, and sixth transistor 432. As known in the art, this is also called a 6T SRAM cell. As described herein, each of the six transistors is a VTFET structure. However, embodiments of the present invention recognize that some or all of these six transistors maybe other types of transistors.

In an embodiment, each bit in the SRAM 400 cell is stored on the third transistor 420, fourth transistor 422, fifth transistor 430, and sixth transistor 432. In an embodiment, the third transistor 420 and fourth transistor 422 form a first inverter. In an embodiment, the fifth transistor 430 and sixth transistor 432 form a second inverter. In an embodiment, the first inverter is cross-coupled with the second inverter. In other words, the output 440 of the first inverter is connected to the gate 446 of the second inverter and the output 442 of the second inverter is connected to the gate 444 of the second inverter. In an embodiment, the output 440 of the first inverter is also connected to a source/drain region of the first transistor 410. In an embodiment, the output 442 of the second inverter is connected to a source/drain region of the second transistor 412. In an embodiment, a source/drain region of both the third transistor 420 and fifth transistor 430 is connected to a power or VDD supply 426 and 436, respectively. In an embodiment, a source/drain region of both the fourth transistor 422 and sixth transistor 432 is connected a ground or GND supply 428 and 438, respectively. In an embodiment, a gate region of the first transistor 410 and second transistor 412 is connected to a word line 450. In an embodiment, word line 450 controls read and write operations in the SRAM 400 cell. In an embodiment, a source/drain region of the first transistor 410 is connected to bitline 460 and a source/drain region of the second transistor 412 is connected to bitline_bar 462. In an embodiment, bitline 460 and bitline_bar 462 are used to transfer data for both read and write operations. It should be noted, an SRAM may only include a bitline 460 or bitline_bar 462 but generally both signals are provided to improve noise margins when reading and writing to the SRAM cell. As shown in FIG. 4, the first transistor 410, second transistor 412, fourth transistor 422, and sixth transistor 432 are "n-type" transistors and the third transistor 420, and fifth transistor 430 are "p-type" but other configurations of doping may be realized.

Figure 5:
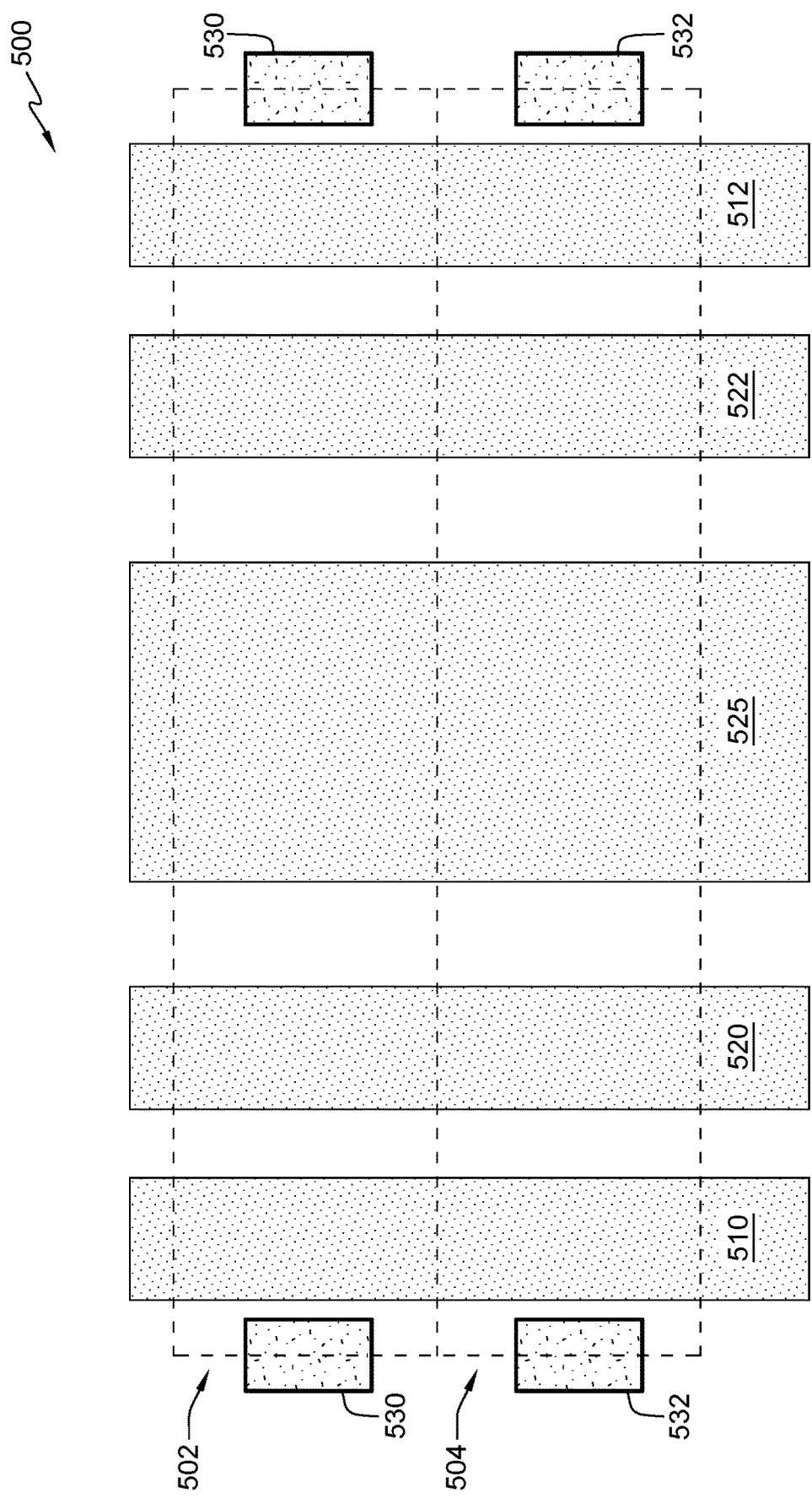
FIG. 5 depicts a top view of two adjacent SRAM in accordance with an embodiment of the present invention.

FIG. 5 depicts a top view of two adjacent SRAM 500 in accordance with an embodiment of the present invention. As shown in FIG. 5, a first SRAM 502 cell is adjacent to a second SRAM 504 cell. For simplicity, only two cells are shown. However, one skilled in the art would recognize that any number of SRAM cell may be found adjacent to each other. It should be noted, the internal transistors for each SRAM cell are not shown in FIG. 5, but as discussed above and below, each SRAM cell includes multiple transistors. In an embodiment, the first SRAM 502 cell is connected to a wordline (not shown) by wordline contacts 530. In an embodiment, the second SRAM 504 cell is connected to a wordline (not shown) by wordline contacts 532. In an embodiment, SRAM 500 includes bitline 510, bitline_bar 512, ground 520, 522 or GND, and power 525 or VDD. In an embodiment, bitline 510, bitline_bar 512, ground 520, ground 522, and power 525 are found on the backside of the SRAM cell(s). In other words, the SRAM cell is on top of a wafer (not shown) and bitline 510, bitline_bar 512, ground 520, ground 522, and power 525 are between the SRAM cell(s) and the wafer. In an embodiment, wordline (not shown) is on the frontside of the SRAM cell(s) or on top of the SRAM cell(s). It should be noted, and discussed below, wordline and bitline/bitline_bar may be swapped in alternative configurations. It should be noted, and discussed below, VDD and GND may be swapped in alternative configurations.

Figure 6:
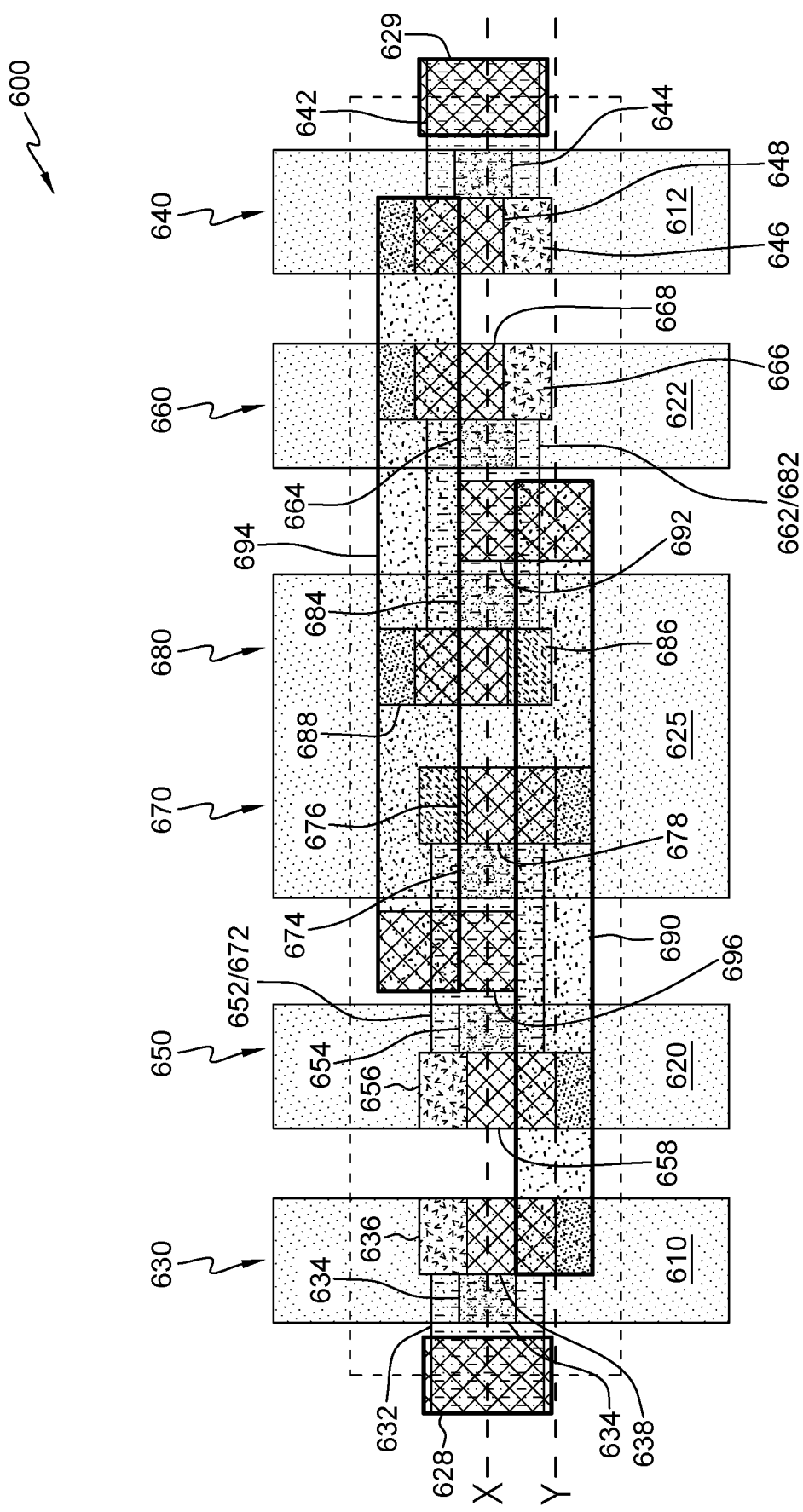
FIG. 6 depicts a top view of an SRAM cell in accordance with a first embodiment of the present invention.

FIG. 6 depicts a top view of an SRAM 600 cell in accordance with a first embodiment of the present invention. In an embodiment, SRAM 600 cell includes a first transistor 630, a second transistor 640, a third transistor 650, a fourth transistor 670, a fifth transistor 660 and a sixth transistor 680. It should be noted, first transistor 630 is similar to first transistor 410, second transistor 640 is similar to second transistor 412, third transistor 650 is similar to third transistor 420, fourth transistor 670 is similar to fourth transistor 422, fifth transistor 660 is similar to fifth transistor 430 and sixth transistor 680 is similar to sixth transistor 432, as described in reference to function in FIG. 4.

As shown in FIG. 6, SRAM 600 cell includes a backside power delivery network which includes power (i.e., VDD) 625, ground (i.e., GND) 620, 622, bitline 610 and bitline_bar 612. As discussed above, the backside power delivery network is found on the backside, or between the device layer (i.e., transistors) and the wafer the device layer is formed on. As shown in FIG. 6, SRAM 600 cell includes a wordline 628, 629 on either end of the SRAM 600 cell and connected to gate regions 632, 642, of the first transistor 630 and second transistor 640, respectively. In an embodiment, the wordline 628, 629 are formed on the frontside, or on top of the device layer and on the opposite side the wafer the device layer is formed on. In an embodiment, the wordlines 628, 629 is within the traditional back end of the line interconnect wiring. As shown in FIG. 6, wordlines 628, 629 are on a first metal layer directly above the transistors of the SRAM 600 cell. In an alternative embodiment, wordline 628, 629 are on any metal layer above the transistors of the SRAM 600 cell as long as the contact from the wordline 628, 629 extends to the gate regions 632, 642, of the first transistor 630 and second transistor 640, respectively In an alternative embodiment, as noted above, power 625 may actually provide ground and ground 620, 622 may provide power. In other words, the power and ground are swapped or flipped. In this alternative embodiment, one skilled in the art would recognize that the layout of a third transistor 650, a fourth transistor 670, a fifth transistor 660 and a sixth transistor 680 may be different. In an alternative embodiment, as noted above, wordline 628, 629 may provide bitline 610 and bitline_bar 612 functionality and bitline 610, bitline_bar 612 may provide wordline functionality. In other words, in this alternative embodiment, the wiring of the wordline is swapped or flipped with the wiring of bitline and bitline_bar. In this alternative embodiment, one skilled in the art would recognize that the layout of a first transistor 630, a second transistor 640, a third transistor 650, a fourth transistor 670, a fifth transistor 660 and a sixth transistor 680 may be different.

In an embodiment, as shown in FIG. 6, the first transistor 630 includes a bottom source/drain region (not shown), a fin 634, a gate region 632, and a top source/drain region 636. In an embodiment, the bottom source/drain region (not shown) is connected to bitline 610 by a backside contact (not shown). In an embodiment, the gate region 632 is connected to wordline 628 through a frontside contact (not shown). In an embodiment, the top source/drain region 636 is connected to cross-couple 690 by a frontside contact 638. In an embodiment, the bottom source/drain region (not shown) may be for the first transistor 630. In an alternative embodiment, the bottom source/drain region (not shown) may be a shared bottom source/drain region that is also a shared bottom source/drain region of any number of first transistor(s) in an adjacent SRAM cell(s) (not shown). In an embodiment, as shown in FIG. 6, the end of fin 634 and the end of the gate region 632 both extend and align on the RX edge of the first transistor 630 closest to the third transistor 650. In an alternative embodiment, the end of fin 634 and the end of gate region 632 may not align with each other and/or may also not align on the RX edge of the first transistor 630. For example, the edge of fin 634 and gate region 632 may align on a left edge of the first transistor 630 farthest from the third transistor 650. In an embodiment, fin 634 has a first length, which is in the same direction as the longer length of SRAM 600 cell, and a second length which is shorter than the first length.

In an embodiment, as shown in FIG. 6, the second transistor 640 includes a bottom source/drain region (not shown), a fin 644, a gate region 642, and a top source/drain region 646. In an embodiment, the bottom source/drain region (not shown) is connected to bitline_bar 612 by a backside contact (not shown). In an embodiment, the gate region 642 is connected to wordline 629 through a frontside contact (not shown). In an embodiment, the top source/drain region 646 is connected to cross-couple 694 by a frontside contact 648. In an embodiment, the bottom source/drain region (not shown) may be for the first transistor 640. In an alternative embodiment, the bottom source/drain region (not shown) may be a shared bottom source/drain region that is also a shared bottom source/drain region of any number of second transistor(s) in an adjacent SRAM cell(s) (not shown). In an embodiment, as shown in FIG. 6, the end of fin 644 and the end of the gate region 642 both extend and align on the RX edge of the second transistor 640 closest to the fifth transistor 660. In an alternative embodiment, the end of fin 644 and the end of gate region 642 may not align with each other and/or may also not align on the RX edge of the second transistor 640. For example, the edge of fin 644 and gate region 642 may align on a right edge of the second transistor 640 farthest from the fifth transistor 660. In an embodiment, fin 644 has a first length, which is in the same direction as the longer length of SRAM 600 cell, and a second length which is shorter than the first length.

In an embodiment, as shown in FIG. 6, the third transistor 650 includes a bottom source/drain region (not shown), a fin 654, a shared gate region 652/672, and a top source/drain region 656. In an embodiment, the bottom source/drain region (not shown) is connected to ground 620 by a backside contact (not shown). In an embodiment, the shared gate region 652/672 is connected to cross-couple 694 by frontside contact 696 and the fourth transistor 670, discussed below. In an embodiment, shared gate region 652/672 is the gate region for both the third transistor 650 and fourth transistor 670. In an embodiment, the top source/drain region 656 is connected to cross-couple 690 by a frontside contact 658. In an embodiment, the bottom source/drain region (not shown) may be for the third transistor 650. In an alternative embodiment, the bottom source/drain region (not shown) may be a shared bottom source/drain region that is also a shared bottom source/drain region of any number of third transistor(s) in an adjacent SRAM cell(s) (not shown). In an embodiment, as shown in FIG. 6, the end of fin 654 and the end of the gate region 652/672 both extend and align on the RX edge of the third transistor 650 closest to the first transistor 630. In an alternative embodiment, the end of fin 654 and the end of gate region 652/672 may not align with each other and/or may also not align on the RX edge of the third transistor 650. For example, the edge of fin 654 may align on a right edge of the second transistor 640 farthest from the first transistor 630. In an embodiment, fin 645 has a first length, which is in the same direction as the longer length of SRAM 600 cell, and a second length which is shorter than the first length.

In an embodiment, as shown in FIG. 6, the fifth transistor 660 includes a bottom source/drain region (not shown), a fin 664, a shared gate region 662/682, and a top source/drain region 666. In an embodiment, the bottom source/drain region (not shown) is connected to ground 622 by a backside contact (not shown). In an embodiment, the shared gate region 662/682 is connected to cross-couple 690 by frontside contact 692 and the sixth transistor 680, discussed below. In an embodiment, shared gate region 652/672 is the gate region for both the third transistor 650 and fourth transistor 670. In an embodiment, the top source/drain region 666 is connected to cross-couple 694 by a frontside contact 668. In an embodiment, the bottom source/drain region (not shown) may be for the fifth transistor 660. In an alternative embodiment, the bottom source/drain region (not shown) may be a shared bottom source/drain region that is also a shared bottom source/drain region of any number of fifth transistor(s) in an adjacent SRAM cell(s) (not shown). In an embodiment, as shown in FIG. 6, the end of fin 664 and the end of the gate region 662/682 both extend and align on the RX edge of the fifth transistor 660 closest to the second transistor 640. In an alternative embodiment, the end of fin 664 and the end of gate region 662/682 may not align with each other and/or may also not align on the RX edge of the fifth transistor 660. For example, the edge of fin 664 may align on a left edge of the fifth transistor 660 farthest from the second transistor 640. In an embodiment, fin 664 has a first length, which is in the same direction as the longer length of SRAM 600 cell, and a second length which is shorter than the first length.

In an embodiment, as shown in FIG. 6, the fourth transistor 670 includes a bottom source/drain region (not shown), a fin 674, a shared gate region 652/672, and a top source/drain region 676. In an embodiment, the bottom source/drain region (not shown) is connected to power 625 by a backside contact (not shown). In an embodiment, the shared gate region 652/672 is connected to cross-couple 694 by frontside contact 696 and the third transistor 650, discussed above. In an embodiment, shared gate region 652/672 is the gate region for both the third transistor 650 and fourth transistor 670, discussed above. In an embodiment, the top source/drain region 676 is connected to cross-couple 690 by a frontside contact 678. In an embodiment, the bottom source/drain region (not shown) may be for the fourth transistor 670. In an alternative embodiment, the bottom source/drain region (not shown) may be a shared bottom source/drain region that is also a shared bottom source/drain region of any number of fourth transistor(s) in an adjacent SRAM cell(s) (not shown). In an embodiment, as shown in FIG. 6, the end of fin 674 and the end of the gate region 652/672 both extend and align on the RX edge of the fourth transistor 670 closest to the sixth transistor 680. In an alternative embodiment, the end of fin 674 and the end of gate region 652/672 may not align with each other and/or may also not align on the RX edge of the fourth transistor 670. For example, the edge of fin 674 and gate region 652/672 may align on a left edge of the fourth transistor 670 closest to the third transistor 650. In an embodiment, fin 674 has a first length, which is in the same direction as the longer length of SRAM 600 cell, and a second length which is shorter than the first length.

In an embodiment, as shown in FIG. 6, the sixth transistor 680 includes a bottom source/drain region (not shown), a fin 684, a shared gate region 662/682, and a top source/drain region 686. In an embodiment, the bottom source/drain region (not shown) is connected to power 625 by a backside contact (not shown). In an embodiment, the shared gate region 662/682 is connected to cross-couple 690 by frontside contact 692 and the fifth transistor 660, discussed above. In an embodiment, shared gate region 662/682 is the gate region for both the fifth transistor 660 and sixth transistor 680, discussed above. In an embodiment, the top source/drain region 686 is connected to cross-couple 694 by a frontside contact 688. In an embodiment, the bottom source/drain region (not shown) may be for the sixth transistor 680. In an alternative embodiment, the bottom source/drain region (not shown) may be a shared bottom source/drain region that is also a shared bottom source/drain region of any number of sixth transistor(s) in an adjacent SRAM cell(s) (not shown). In an embodiment, as shown in FIG. 6, the end of fin 684 and the end of the gate region 662/682 both extend and align on the RX edge of the sixth transistor 680 closest to the fourth transistor 670. In an alternative embodiment, the end of fin 684 and the end of gate region 662/682 may not align with each other and/or may also not align on the RX edge of the sixth transistor 680. For example, the edge of fin 684 and gate region 662/682 may align on a right edge of the sixth transistor 680 closest to the fifth transistor 660. In an embodiment, fin 684 has a first length, which is in the same direction as the longer length of SRAM 600 cell, and a second length which is shorter than the first length.

In an embodiment, as discussed above, SRAM 600 cell includes cross-couple 690 and cross-couple 694. In an embodiment, cross-couple 690 and cross-couple 694 are on any metal layer above the transistors of the SRAM 600 cell. In an embodiment, cross-couple 690 and cross-couple 694 may be a metal wire track. In an embodiment, cross-couple 690 is connected to the first transistor 630, by frontside contact 638, third transistor 650 by frontside contact 658, fourth transistor 670, by frontside contact 678, and shared gate region 662/682 by frontside contact 692. In an embodiment, cross-couple 694 is connected to the second transistor 640, by frontside contact 648, fifth transistor 660 by frontside contact 668, sixth transistor 680, by frontside contact 688, and shared gate region 652/672 by frontside contact 696.

Figure 7:
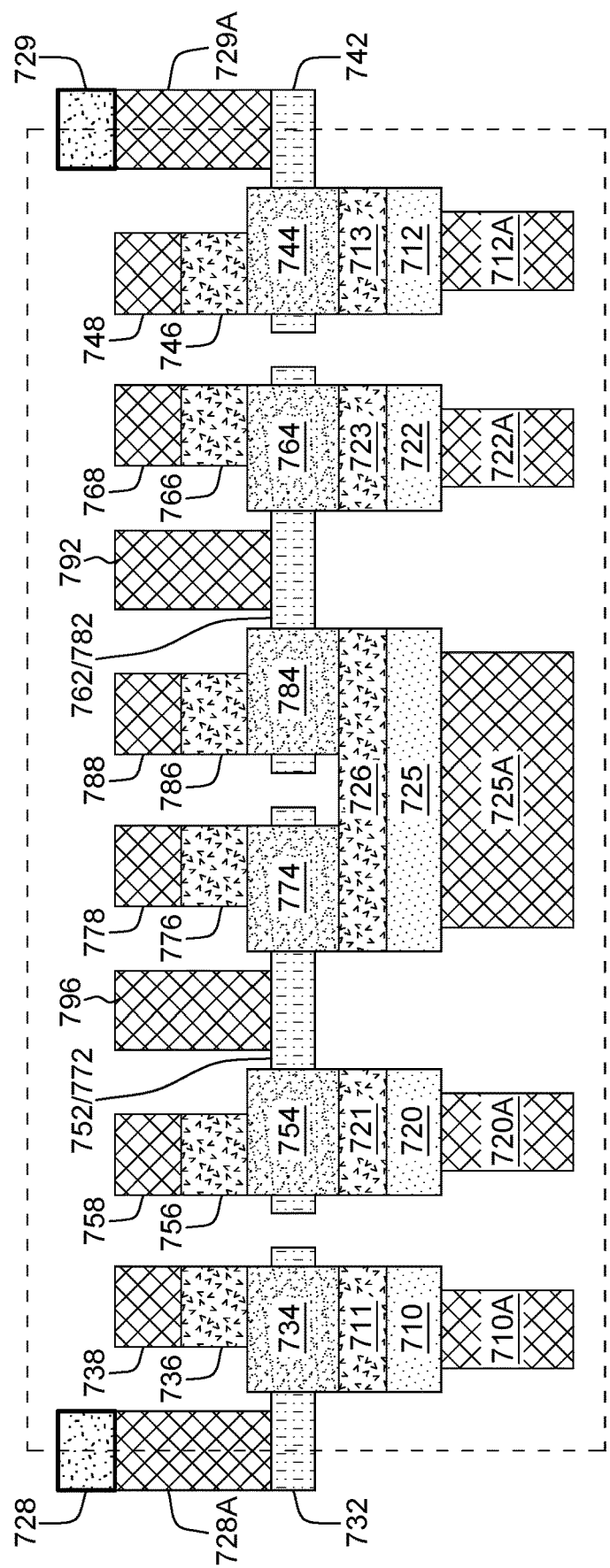
FIG. 7 depicts a cross-sectional view of section X of an SRAM cell in accordance with an embodiment of the present invention.

FIG. 7 depicts a cross-sectional view of section X of an SRAM 700 cell in accordance with an embodiment of the present invention. In an embodiment, as shown in FIG. 7, SRAM 700 cell includes a backside power delivery network which includes power (i.e., VDD) 725, ground (i.e., GND) 720, 722, bitline 710 and bitline_bar 712. As discussed above, the backside power delivery network is found on the backside, or between the device layer (i.e., transistors) and the wafer the device layer is formed on. In an embodiment, power 725 may be connected to the backside power delivery network by backside power delivery network contact 725A. In an embodiment, ground 720, 722 may be connected to the backside power delivery network by backside power delivery network contact 720A, 722A, respectively. In an embodiment, bitline 710 may be connected to the backside power delivery network by backside power delivery network contact 710A. In an embodiment, bitline_bar 712 may be connected to the backside power delivery network by backside power delivery network contact 712A.

In an embodiment, bitline 710 is connected to bottom source/drain region 711. In an embodiment, bitline_bar 712 is connected to bottom source/drain region 713. In an embodiment, ground 720 is connected to bottom source/drain region 721. In an embodiment, ground 722 is connected to bottom source/drain region 723. In an embodiment, power 725 is connected to shared bottom source/drain region 726. In an alternative embodiment, shared bottom source/drain region 726 may be two individual and separate bottom source/drain regions for each VTFET.

As shown in FIG. 7, SRAM 700 cell includes a wordline 728, 729 on either end of the SRAM 700 cell and connected to gate regions 732, 742, of the first transistor 630 and second transistor 640, respectively. In an embodiment, the wordline 728, 729 are formed on the frontside, or on top of the device layer and on the opposite side the wafer the device layer is formed on. In an embodiment, the wordlines 728, 729 is within the traditional back end of the line interconnect wiring. As shown in FIG. 7, wordlines 728, 729 are on a first metal layer directly above the transistors of the SRAM 600 cell. In an alternative embodiment, wordline 728, 729 are on any metal layer above the transistors of the SRAM 600 cell as long as the contact from the wordline 728, 729 extends to the gate regions 732, 742, of the first transistor 630 and second transistor 640, respectively. In an embodiment, the wordline 728, 729 is connected to gate regions 732, 742, respectively, by a frontside contact.

In an embodiment, gate region 732 surrounds at least a portion of fin 734 and fin 734 is connected to top source/drain region 736. In an embodiment, top source/drain region 736 is connected to frontside contact 738 and frontside contact 738 is connected to cross-couple 690 (not shown), discussed above. In an embodiment, gate region 742 surrounds at least a portion of fin 744 and fin 744 is connected to top source/drain region 746. In an embodiment, top source/drain region 746 is connected to frontside contact 748 and frontside contact 748 is connected to cross-couple 694 (not shown), discussed above.

In an embodiment, shared gate region 752/772 surrounds at least a portion of fin 754 and fin 774. In an embodiment, fin 754 is connected to top source/drain region 756. In an embodiment, top source/drain region 756 is connected to frontside contact 758 and frontside contact 758 is connected to cross-couple 690 (not shown), discussed above. In an embodiment, fin 774 is connected to top source/drain region 776. In an embodiment, top source/drain region 776 is connected to frontside contact 778 and frontside contact 778 is connected to cross-couple 690 (not shown), discussed above. In an embodiment, shared gate region 752/772 is connected to frontside contact 796 and frontside contact 796 is connected to cross-couple 694 (not shown), discussed above.

In an embodiment, shared gate region 762/782 surrounds at least a portion of fin 764 and fin 784. In an embodiment, fin 764 is connected to top source/drain region 766. In an embodiment, top source/drain region 766 is connected to frontside contact 768 and frontside contact 768 is connected to cross-couple 694 (not shown), discussed above. In an embodiment, fin 784 is connected to top source/drain region 786. In an embodiment, top source/drain region 786 is connected to frontside contact 788 and frontside contact 788 is connected to cross-couple 694 (not shown), discussed above. In an embodiment, shared gate region 762/782 is connected to frontside contact 792 and frontside contact 792 is connected to cross-couple 690 (not shown), discussed above.

Figure 8:
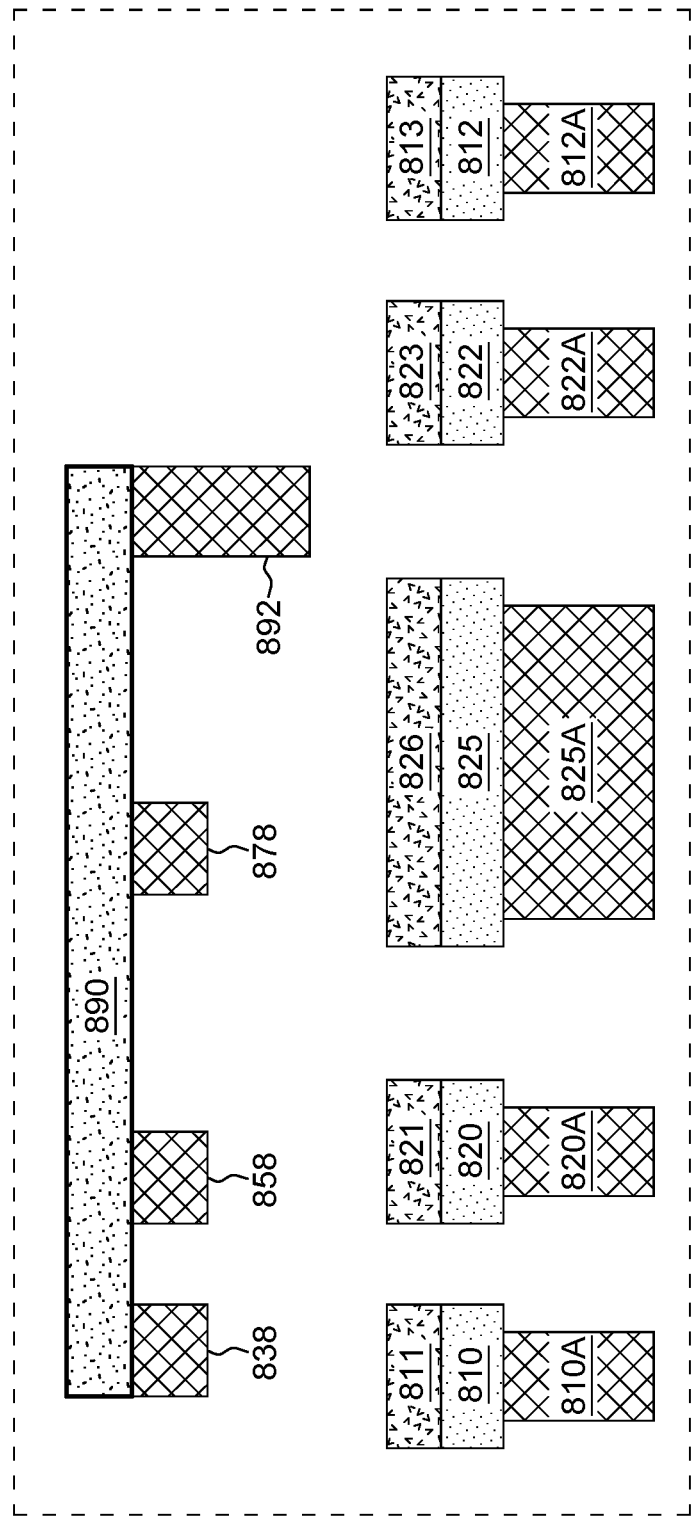
FIG. 8 depicts a cross-sectional view of section Y of an SRAM cell in accordance with an embodiment of the present invention.

FIG. 8 depicts a cross-sectional view of section Y of an SRAM 800 cell in accordance with an embodiment of the present invention. In an embodiment, as shown in FIG. 8, SRAM 800 cell includes a backside power delivery network which includes power (i.e., VDD) 825, ground (i.e., GND) 820, 822, bitline 810 and bitline_bar 812. As discussed above, the backside power delivery network is found on the backside, or between the device layer (i.e., transistors) and the wafer the device layer is formed on. In an embodiment, power 825 may be connected to the backside power delivery network by backside power delivery network contact 824. In an embodiment, ground 820, 822 may be connected to the backside power delivery network by backside power delivery network contact 819, 821, respectively. In an embodiment, bitline 810 may be connected to the backside power delivery network by backside power delivery network contact 809. In an embodiment, bitline_bar 812 may be connected to the backside power delivery network by backside power delivery network contact 812A. In an embodiment, power 825 may be connected to the backside power delivery network by backside power delivery network contact 825A. In an embodiment, ground 820, 822 may be connected to the backside power delivery network by backside power delivery network contact 820A, 822A, respectively. In an embodiment, bitline 810 may be connected to the backside power delivery network by backside power delivery network contact 810A. In an embodiment, bitline_bar 812 may be connected to the backside power delivery network by backside power delivery network contact 812A.

In an embodiment, bitline 810 is connected to bottom source/drain region 811. In an embodiment, bitline_bar 812 is connected to bottom source/drain region 813. In an embodiment, ground 820 is connected to bottom source/drain region 821. In an embodiment, ground 822 is connected to bottom source/drain region 823. In an embodiment, power 825 is connected to shared bottom source/drain region 826. In an alternative embodiment, shared bottom source/drain region 826 may be two individual and separate bottom source/drain regions for each VTFET.

In an embodiment, as shown in FIG. 8, SRAM 800 cell includes cross-couple 890. In an embodiment, cross-couple 890 is connected to frontside contact 838, frontside contact 858, frontside contact 878, and frontside contact 892. In an embodiment, frontside contact 838 is connected to a top source/drain region (not shown), discussed above. In an embodiment, frontside contact 858 is connected to a top source/drain region (not shown), discussed above. In an embodiment, frontside contact 878 is connected to a top source/drain region (not shown), discussed above. In an embodiment, frontside contact 892 is connected to a shared gate region (not shown), discussed above.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor memory cell comprising:
six vertical-transport field-effect transistors (VTFET) on a wafer, wherein the six VTFET are in a first layer, and wherein the six VTFET are aligned with one another in a first row,
wherein each VTFET of the six VTFET includes an isolated fin, and the isolated fin of each VTFET of the six VTFET are aligned with one another in the first row.

2. The semiconductor memory cell of claim 1, wherein power for two of the VTFET of the six VTFET is connected to a power delivery network on a backside of the wafer.

3. The semiconductor memory cell of claim 1, wherein ground for two of the VTFET of the six VTFET is connected to a power delivery network on a backside of the wafer.

4. The semiconductor memory cell of claim 1, wherein a bitline and a bitline bar for two of the VTFET of the six VTFET is connected to a power delivery network on a backside of the wafer and wherein a wordline for two of the VTFET of the six VTFET is connected to a power delivery network on a frontside of the wafer.

5. The semiconductor memory cell of claim 1, wherein a bitline and a bitline bar for two of the VTFET of the six VTFET is connected to a power delivery network on a frontside of the wafer and wherein a wordline for two of the VTFET of the six VTFET is connected to a power delivery network on a backside of the wafer.

6. The semiconductor memory cell of claim 1, wherein a first metal wire electrically connects a source/drain region of a first VTFET, a source/drain region of a second VTFET, a source/drain region of a third VTFET, a gate region of a fourth VTFET, and a gate region of a fifth VTFET.

7. The semiconductor memory cell of claim 6, wherein a second metal wire electrically connects a gate region of the second VTFET, a gate region of the third VTFET, a source/drain region of the fourth VTFET, a source/drain region of the fifth VTFET, and a source/drain region of a sixth VTFET.

8. The semiconductor memory cell of claim 6, wherein the first metal wire is within the semiconductor memory cell.

9. The semiconductor memory cell of claim 7, wherein the second metal wire is within the semiconductor memory cell.

10. The semiconductor memory cell of claim 1, wherein a fin end and a gate end of one or more VTFET of the six VTFET are aligned to a bottom source/drain region edge.

11. The semiconductor memory cell of claim 1, wherein:
the six VTFET form the memory cell; and
wherein at least one memory cell is in a row adjacent to at least one other memory cell.

12. A semiconductor SRAM comprising:
six vertical-transport field-effect transistors (VTFET) on a wafer, wherein the six VTFET are in a first layer, and wherein the six VTFET are aligned with one another in a first row,
wherein each VTFET of the six VTFET includes an isolated fin, and the isolated fin of each VTFET of the six VTFET are aligned with one another in the first row.

13. A semiconductor memory array, comprising:
six vertical-transport field-effect transistors (VTFET) aligned with one another and arranged in a memory cell of one or more memory cells in a first layer on a wafer, wherein:
each VTFET of the six VTFET includes an isolated fin, and the isolated fin of each VTFET of the six VTFET are aligned with one another in the first row.

14. The semiconductor memory array of claim 13, wherein each memory cell of the one or more memory cells share a first continuous bottom source/drain region for a first VTFET and a second VTFET in each memory cell, wherein the first continuous bottom source/drain region is connected to a power delivery network on a backside of the wafer.

15. The semiconductor memory array of claim 14, wherein each memory cell of the one or more memory cells share a second continuous bottom source/drain region for a third VTFET and a fourth VTFET in each memory cell, wherein the second continuous bottom source/drain region is connected to a power delivery network on the backside of the wafer.

16. The semiconductor memory array of claim 14, wherein each memory cell of the one or more memory cells share a third continuous bottom source/drain region for a fifth VTFET and a fourth continuous bottom source/drain region for a sixth VTFET in each memory cell, wherein the third continuous bottom source/drain region is connected to a power delivery network on a backside of the wafer, and wherein the fourth continuous bottom source/drain region is connected to a power delivery network on the backside of the wafer.

17. The semiconductor memory array of claim 13, wherein each memory cell of the one or more memory cells are arranged in a single row.

\* \* \* \* \*